(12) United States Patent
Itoh et al.

(10) Patent No.: US 8,310,306 B2
(45) Date of Patent: Nov. 13, 2012

(54) OPERATIONAL AMPLIFIER

(75) Inventors: Shogo Itoh, Kasugai (JP); Hisao Suzuki, Kasugai (JP)

(73) Assignee: Fujitsu Semiconductor Limited, Yokohama (JP)

(*) Notice: Subject to any disclaimer, the term of this patent is extended or adjusted under 35 U.S.C. 154(b) by 77 days.

(21) Appl. No.: 12/796,500

(22) Filed: Jun. 8, 2010

(65) Prior Publication Data
US 2010/0308913 A1    Dec. 9, 2010

(30) Foreign Application Priority Data
Jun. 9, 2009    (JP) ................... 2009-138218

(51) Int. Cl.
*H03F 3/45*    (2006.01)
(52) U.S. Cl. ....................... 330/255; 330/257

(58) Field of Classification Search .......... 330/253, 330/255, 257
See application file for complete search history.

(56) References Cited

U.S. PATENT DOCUMENTS 7,167,050 B2 *    1/2007    Suzuki ............... 330/257
7,786,801 B2 *    8/2010    Kim ..................... 330/255

FOREIGN PATENT DOCUMENTS

JP    11-154832 A    6/1999

* cited by examiner

*Primary Examiner* — Steven J Mottola
(74) *Attorney, Agent, or Firm* — Arent Fox LLP

(57) ABSTRACT

An operational amplifier includes a first amplifier to which an input signal is applied, and a second amplifier to which an output of the first amplifier is applied, wherein the second amplifier includes a first transistor including a gate to which the output of the first amplifier is applied, and a second transistor including a gate to which the output of the first amplifier is applied, and a drain coupled to a source of the first transistor.

17 Claims, 4 Drawing Sheets

US 8,310,306 B2

OPERATIONAL AMPLIFIER

CROSS-REFERENCE TO RELATED APPLICATION

This application is based upon and claims the benefit of priority of the prior Japanese Patent Application No. 2009-138218, filed on Jun. 9, 2009, the entire contents of which are incorporated herein by reference.

FIELD

The embodiment discussed herein relates to an operational amplifier.

BACKGROUND

FIG. 4 is a circuit diagram illustrating an operational amplifier according to the related art (for example, see Japanese Patent Application Laid-Open Publication No. 11-154832).

As illustrated in FIG. 4, transistors Tr1 and Tr2 make up a current mirror circuit. The transistor Tr2 provided on the output side of the current mirror circuit operates as a constant current source. That is, the transistor Tr2 passes a drain current that has substantially the same value as the value of a current that flows through a first current source 1.

The drain of the transistor Tr2 is coupled to the sources of transistors Tr3 and Tr4. The drain of the transistor Tr3 is coupled to the drain of a transistor Tr5, the gate of the transistor Tr5, and the gate of a transistor Tr6. The source of the transistor Tr5 is coupled to a ground GND. The drain of the transistor Tr4 is coupled to the drain of the transistor Tr6. The source of the transistor Tr6 is coupled to the ground GND. An input signal VM is applied to the gate of the transistor Tr3. An input signal VP is applied to the gate of the transistor Tr4. The transistors Tr2 to Tr6 are included in a differential input circuit activated based on the constant current supplied from the transistor Tr2.

A coupling point of the drains of the transistors Tr3 and Tr5, that is, a node N1, is coupled to the gate of a transistor Tr11. A coupling point of the drains of the transistors Tr4 and Tr6, that is, a node N2, is coupled to the gate of a transistor Tr12. The sources of the transistors Tr11 and Tr12 are coupled to the ground GND through a second current source 2.

The drain of the transistor Tr11 is coupled to the drain of a transistor Tr13. The source of the transistor Tr13 is coupled to a power source Vcc. The drain of the transistor Trig is coupled to the drain of a transistor Tr14, and the gates of the transistors Tr13 and Tr14. The source of the transistor Tr14 is coupled to the power source Vcc. The transistors Tr11 to Tr14 and the second current source 2 are included in a differential amplifier circuit that amplifies a differential voltage between the node N1 and the node N2.

A coupling point of the drains of the transistors Tr11 and Tr13, that is, a node N3, is coupled to the gate of an output transistor Tr21. The source of the transistor Tr21 is coupled to the power source Vcc. The drain of the transistor Tr21 is coupled to an output terminal To.

The node N2 is coupled to the gate of an output transistor Tr22. The drain of the transistor Tr22 is coupled to the output terminal To, and the source of the transistor Tr22 is coupled to the ground GND. An output signal Vout is applied to the gate of the transistor Tr3 as the input signal VM.

For example, when the voltage value of the input signal VP becomes higher than the voltage value of the input signal VM (the output signal Vout), the value of the drain current of the transistor Tr4 decreases and becomes lower than the value of the drain current of the transistor Tr3. As a result, the voltage level of the node N2 falls and the transistor Tr22 is turned off.

When the potential of the node N2 becomes lower than the potential of the node N1, the potential of the node N3 decreases based on an operation of the differential amplifier circuit. When the potential of the node N3 decreases, the output transistor Tr21 is turned on and the voltage level of the output signal Vout rises. As a result, the voltage values of the input signal VP and the output signal Vout (the input signal VM) become substantially the same.

As the potential of the node N3 decreases, the drain current supplied from the transistor Tr21 to the transistor Tr22 increases. When the drain current of the transistor Tr22 increases, the value of a voltage between the gate and the source (hereinafter referred to as a "gate-source voltage") of the transistor Tr22 increases. As a result, the potential of the node N2 increases. The potentials of the nodes N1 and N2 become substantially the same by controlling the drain current of the transistor Tr21 based on the differential voltage between the nodes N1 and N2. When the potentials of the nodes N1 and N2 are substantially the same, the drain voltages of the transistors Tr3 and Tr4 are substantially the same. Accordingly, a voltage between the source and the drain (hereinafter referred to as the "source-drain voltage") of the transistor Tr3 and the source-drain voltage of the transistor Tr4 become substantially the same, and the drain currents of the transistor Tr3 and Tr4 become substantially the same. As a result, the gate-source voltages of the transistors Tr3 and Tr4 may be substantially the same, and generation of an offset voltage of the input signal VP and the output signal Vout may be reduced if not prevented.

SUMMARY

According to an aspect of an embodiment, an operational amplifier includes a first amplifier to which an input signal is applied, and a second amplifier to which an output of the first amplifier is applied, wherein the second amplifier includes a first transistor including a gate to which the output of the first amplifier is applied, and a second transistor including a gate to which the output of the first amplifier is applied, and a drain coupled to a source of the first transistor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Figure 1:
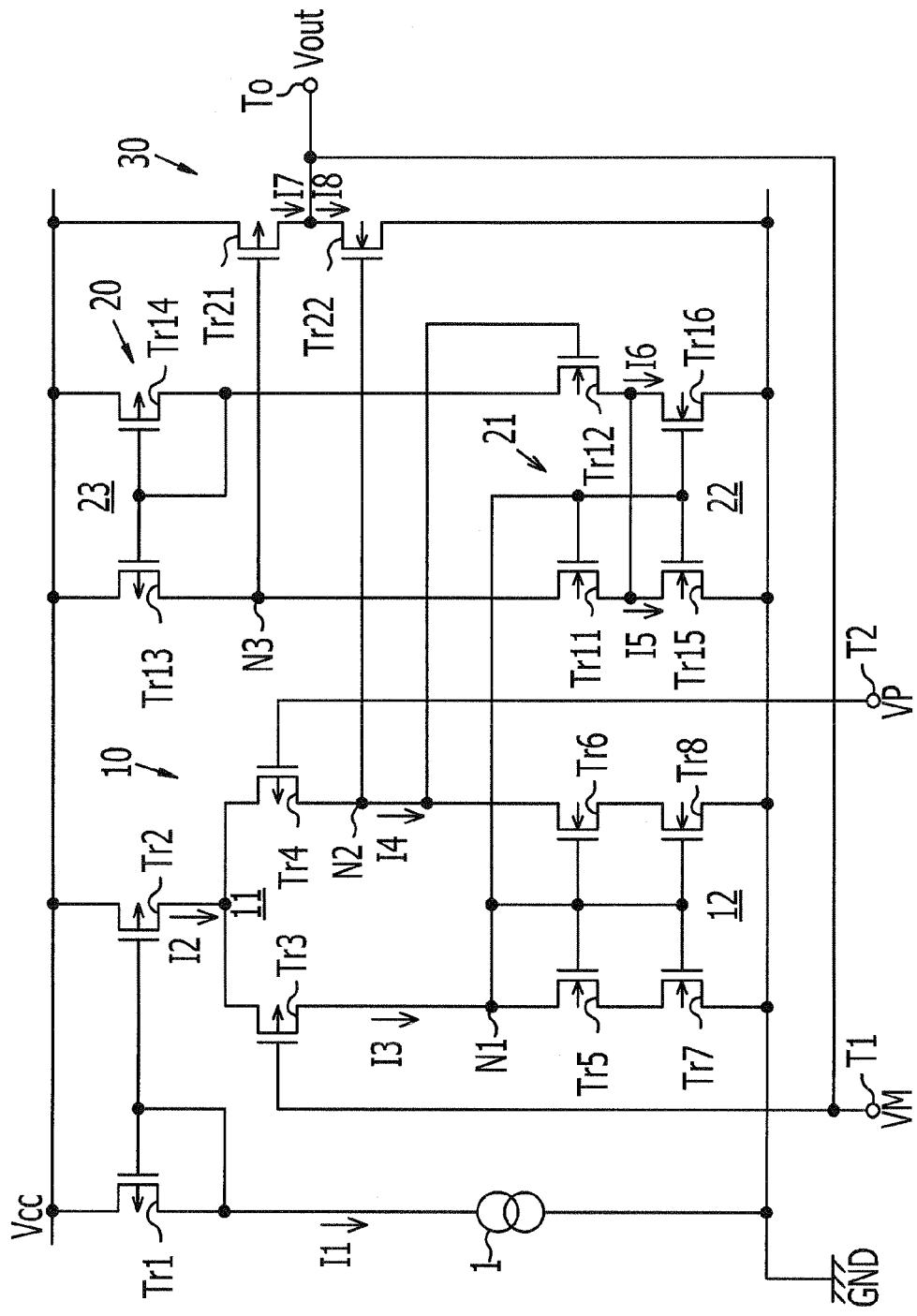
FIG. 1 is a circuit diagram illustrating an example of an operational amplifier according to an embodiment.

FIG. 1 is a circuit diagram illustrating an example of an operational amplifier according to an embodiment.

As illustrated in FIG. 1, the operational amplifier includes a current source 1, a first differential amplifier circuit 10, a second differential amplifier circuit 20, and an output stage circuit 30. The current source 1 supplies a constant current I1 to a transistor Tr1. The transistor Tr1 is coupled to a transistor Tr2, and the transistors Tr1 and Tr2 make up a current mirror circuit. The transistors Tr1 and Tr2 are P-channel metal oxide semiconductor (PMOS) transistors for example. The drain of the transistor Tr1 is coupled to the gates of the transistors Tr1 and Tr2. The sources of the transistors Tr1 and Tr2 are coupled to a power source Vcc. The electrical characteristics of the transistor Tr2 provided on the output side are substantially the same as the electrical characteristics of the transistor Tr1 provided on the input side. Accordingly, the transistor Tr2 on the output side operates as a constant current source and passes a current I2 that has substantially the same value as the value of the constant current I1 that flows through the transistor Tr1 on the input side.

The first differential amplifier circuit 10 includes the transistor Tr2 that operates as the constant current source, a differential pair 11, and a current mirror circuit 12. The differential pair 11 includes a transistor Tr3 and a transistor Tr4. The transistors Tr3 and Tr4 are PMOS transistors for example. The gate of the transistor Tr3 is coupled to an inverting input terminal T1 to which an input signal VM is applied. The gate of the transistor Tr4 is coupled to a non-inverting input terminal T2 to which an input signal VP is applied. The sources of the transistors Tr3 and Tr4 are coupled to the drain of the transistor Tr2. The drain of the transistor Tr3 is coupled to the drain of a transistor Tr5 in the current mirror circuit 12. The drain of the transistor Tr4 is coupled to the drain of a transistor Tr6 in the current mirror circuit 12. The transistors Tr5 and Tr6 are N-channel metal oxide semiconductor (NMOS) transistors for example.

The current mirror circuit 12 includes the transistors Tr5 and Tr6, and transistors Tr7 and Tr8. The transistors Tr7 and Tr8 are NMOS transistors for example. The transistors Tr5 and Tr7 are provided on the input side of the current mirror circuit 12, and the transistors Tr6 and Tr8 are provided on the output side of the current mirror circuit 12. The drain of the transistor Tr5 is coupled to the gates of the transistors Tr5 to Tr8. The source of the transistor Tr5 is coupled to the drain of the transistor Tr7. The source of the transistor Tr7 is coupled to a ground GND (a low potential power source). Thus, the transistors Tr5 and Tr7 are coupled in series.

The source of the transistor Tr6 is coupled to the drain of the transistor Tr8, and the source of the transistor Tr8 is coupled to the ground GND. Similar to the transistors Tr5 and Tr7, the transistors Tr6 and Tr8 are coupled in series. The electrical characteristics of the transistor Tr6 on the output side are substantially the same as the electrical characteristics of the transistor Tr5 on the input side, and the electrical characteristics of the transistor Tr8 on the output side are substantially the same as the electrical characteristics of the transistor Tr7 on the input side. Accordingly, the transistors Tr6 and Tr8 on the output side pass a current I4 that has substantially the same value of the value of a current I3 that flows through the transistors Tr5 and Tr7 on the input side.

A node N1 at a coupling point of the drains of the transistors Tr3 and Tr5, and a node N2 at a coupling point of the drains of the transistors Tr4 and Tr6 is coupled to the second differential amplifier circuit 20. The node N2 is coupled also to the gate of an output transistor Tr22 on the pull-down side of the output stage circuit 30.

The first differential amplifier circuit 10 is activated based on the current I2 supplied from the transistor Tr2, amplifies a potential difference between the potential of the input signal VP and the potential of the input signal VM, and outputs the amplified potential difference to the second differential amplifier circuit 20 and the output transistor Tr22.

The second differential amplifier circuit 20 includes a differential pair 21, a current source 22, and a current mirror circuit 23. The differential pair 21 includes transistors Tr11 and Tr12. The transistors Tr11 and Tr12 are NMOS transistors for example. The gate of the transistor Tr11 is coupled to the node N1. The gate of the transistor Tr12 is coupled to the node N2. The source of the transistor Tr11 is coupled to the drain of a transistor Tr15. The source of the transistor Tr12 is coupled to the drain of a transistor Tr16. The transistors Tr15 and Tr16 are NMOS transistors for example. The transistors Tr11 and Tr12 may have substantially the same electrical characteristics. The transistors Tr5, Tr6, Tr11, and Tr12 may have substantially the same ratio of a channel width (W) to a channel length (L) (hereinafter referred to as the "W/L ratio"). According to the embodiment, all of the transistors Tr5, Tr6, Tr11, and Tr12 may have substantially the same electrical characteristics or substantially the same size.

The gates of the transistors Tr15 and Tr16 are coupled to the node N1. The sources of the transistors Tr15 and Tr16 are coupled to the ground GND. The transistors Tr15 and Tr16, and the transistor Tr7 are coupled to each other and make up a current mirror circuit. The transistors Tr15 and Tr16 may have substantially the same electrical characteristics. The transistors Tr7, Tr8, Tr15, and Tr16 may have substantially the same W/L ratio. All of the transistors Tr7, Tr8, Tr15, and Tr16 may have substantially the same electrical characteristics or substantially the same size. Thus, the transistors Tr15 and Tr16 operate as the current source 22. The transistor Tr15 passes a current I5, and the transistor Tr16 passes a current I6. The currents I5 and I6 have substantially the same value as the value of the current I3 that flows through the transistor Tr7 (Tr5). A current that flows through the transistors Tr15 and Tr16 that make up the current source 22 is controlled based on the gate voltage of the transistor Tr7 (the drain voltage of the transistor Tr5). The current mirror circuit 12 operates also as a current control circuit that controls a current of the current source 22.

The drain of the transistor Tr11 is coupled to the drain of a transistor Tr13. The drain of the transistor Tr12 is coupled to the drain of a transistor Tr14. The transistors Tr13 and Tr14 are PMOS transistors for example. The transistors Tr13 and Tr14 are coupled to each other and operate as the current mirror circuit 23.

A node N3 at a coupling point of the drains of the transistors Tr11 and Tr13 is coupled to the gate of an output transistor Tr21 on the pull-up side of the output stage circuit 30.

The second differential amplifier circuit 20 is activated based on the current supplied from the current source 22, and operates as a differential voltage detection circuit that detects a differential voltage between the nodes N1 and N2.

The output stage circuit 30 includes the output transistor Tr21, and the output transistor Tr22. For example, the output transistor Tr21 is a PMOS transistor, and the output transistor Tr22 is an NMOS transistor. The gate of the output transistor Tr21 is coupled to the node N3. The source of the output transistor Tr21 is coupled to the power source Vcc. The drain of the output transistor Tr21 is coupled to an output terminal To. The transistor Tr21 passes a drain current I7 dependent on the potential of the node N3 as an idling current.

The gate of the output transistor Tr22 is coupled to the node N2. The drain of the output transistor Tr22 is coupled to the output terminal To. The source of the output transistor Tr22 is coupled to the ground GND. The transistor Tr22 passes a drain current I8 dependent on the potential of the node N2 as an idling current.

The operational amplifier according to the embodiment operates so that an output signal Vout is input as the input signal VM. That is, the inverting input terminal T1 and the output terminal To are coupled to each other and the operational amplifier operates as a voltage follower circuit. In the operational amplifier that operates as a voltage follower circuit, the transistors Tr3 and Tr4 pass currents that have substantially the same value and cause the drain voltages of the transistors Tr3 and Tr4 (the potentials of the nodes N1 and N2) to be substantially the same.

The current I2 supplied from the transistor Tr2 to the differential pair 11 is divided into the currents I3 and I4 using the transistors Tr3 and Tr4. The current I3 that flows through the transistor Tr3 further flows through the transistors Tr5 and Tr7 coupled in series. The current I4 that flows through the transistor Tr4 further flows through the transistors Tr6 and Tr8 coupled in series. The transistors Tr7 and Tr8 have substantially the same electrical characteristics. The source voltages of the transistors Tr7 and Tr8 have substantially the same value, and the gate voltages of the transistors Tr7 and Tr8 also have substantially the same value. The drain of the transistor Tr7 is coupled to the source of the transistor Tr5, and the drain of the transistor Tr8 is coupled to the source of the transistor Tr6. Thus, the output impedances of the sources of the transistors Tr5 and Tr6 may be substantially the same. The drain voltage of the transistor Tr5 is supplied in common to the gates of the transistors Tr5 and Tr6. That is, the transistors Tr5 and Tr6 operate as a current mirror circuit. The transistor Tr6 is coupled to the transistor Tr5, and has substantially the same electrical characteristics as the electrical characteristics of the transistor Tr5. The transistor Tr8 is coupled to the transistor Tr7, and has substantially the same electrical characteristics as the electrical characteristics of the transistor Tr7. Thus, the transistor Tr6 operates with substantially the same electrical characteristics as the electrical characteristics of the transistor Tr5, and the transistor Tr8 operates with substantially the same electrical characteristics as the electrical characteristics of the transistor Tr7. Accordingly, the transistors Tr6 and Tr8 may pass a current that has substantially the same value as the value of the current I3 that flows through the transistors Tr5 and Tr7.

Each node voltage of the transistors Tr5 and Tr7 coupled in series is determined based on the current I3 and the electrical characteristics of the transistors Tr5 and Tr7. The drain voltage of the transistor Tr5 is, that is, the gate voltages of the transistors Tr5 and Tr7 are determined so that the transistors Tr5 and Tr7 may operate. Even when variation in the characteristics of the transistors Tr5 and Tr7 is caused by a manufacturing process for example, the drain voltage of the transistor Tr5 is determined so that the transistor Tr5 may operate.

The transistor Tr11 in the second differential amplifier circuit 20, the gate of which the drain voltage of the transistor Tr5 is supplied to as an input voltage, is coupled to the transistor Tr6. The transistor Tr15 in the second differential amplifier circuit 20 is coupled to the transistor Tr8. The transistor Tr11 has substantially the same electrical characteristics as the electrical characteristics of the transistor Tr6 (Tr5), and the transistor Tr15 has substantially the same electrical characteristics as the electrical characteristics of the transistor Tr8 (Tr7). Thus, the transistor Tr11 may operate with substantially the same electrical characteristics as the electrical characteristics of the transistor Tr6 (Tr5), and the transistor Tr15 may operate with substantially the same electrical characteristics as the electrical characteristics of the transistor Tr8 (Tr7). The current I5, which has substantially the same value as the value of the current I3 that flows through the transistor Tr7, flows through the transistor Tr15, and the source potential of the transistor Tr11 becomes substantially the same as the source potential of the transistor Tr5. The drain voltage of the transistor Tr5 is supplied in common to the gates of the transistors Tr11 and Tr5. Since the transistor Tr11 is applied with the gate-source voltage based on the drain voltage of the transistor Tr5, the transistor Tr11 may operate as desired.

When variation in the characteristics of the transistors Tr5 and Tr7 is caused by a manufacturing process for example, the characteristics of the transistors Tr11 and Tr15 vary as well. Accordingly, the transistors Tr11 and Tr15 may operate with substantially the same electrical characteristics as the electrical characteristics of the transistors Tr5 and Tr7. As a result, the transistor Tr11 may operate as desired regardless of the variation in the characteristics.

The transistors Tr12 and Tr16 differ from the transistors Tr11 and Tr15 in that the gate of the transistor Tr12 is coupled to the node N2. The operational amplifier according to the embodiment, which operates as a voltage follower circuit, causes the voltages of the nodes N1 and N2 to be substantially the same. Thus, the voltage relationship between the transistors Tr12 and Tr16 and the voltage relationship between the transistors Tr11 and Tr15 are substantially the same. Accordingly, the transistors Tr12 and Tr16 may operate similarly to the transistors Tr11 and Tr15. Since, similar to the transistor Tr11, the transistor Tr12 is applied with the gate-source voltage from the current mirror circuit 12 regardless of the variation in the characteristics, the transistor Tr11 may operate as desired.

Described below is a case where the voltage level of the input signal VP rises after the output signal Vout is maintained at the voltage level of the input signal VP.

When the voltage level of the input signal VP rises, the value of the drain current I3 of the transistor Tr3 increases, and the value of the drain current I4 of the transistor Tr4 decreases. Accordingly, the voltage value of the node N2 decreases and the transistor Tr22 is turned off.

When the potential of the node N2 becomes lower than the potential of the node N1, the potential of the node N3 in the second differential amplifier circuit 20 decreases, and the output transistor Tr21 is turned on. As a result, the voltage level of the output signal Vout rises and the output signal Vout is maintained at the voltage level of the input signal VP. When the potential of the node N3 decreases based on the difference between the potentials of the nodes N1 and N2, the value of the gate-source voltage of the transistor Tr21 increases, and the value of the current supplied from the transistor Tr21 to the transistor Tr22 increases. When the value of the drain current of the transistor Tr22 increases, the value of the gate-source voltage of the transistor Tr22 increases. As a result, the potential of the node N2 increases. Thus, the potentials of the nodes N1 and N2 become substantially the same.

Figure 4:
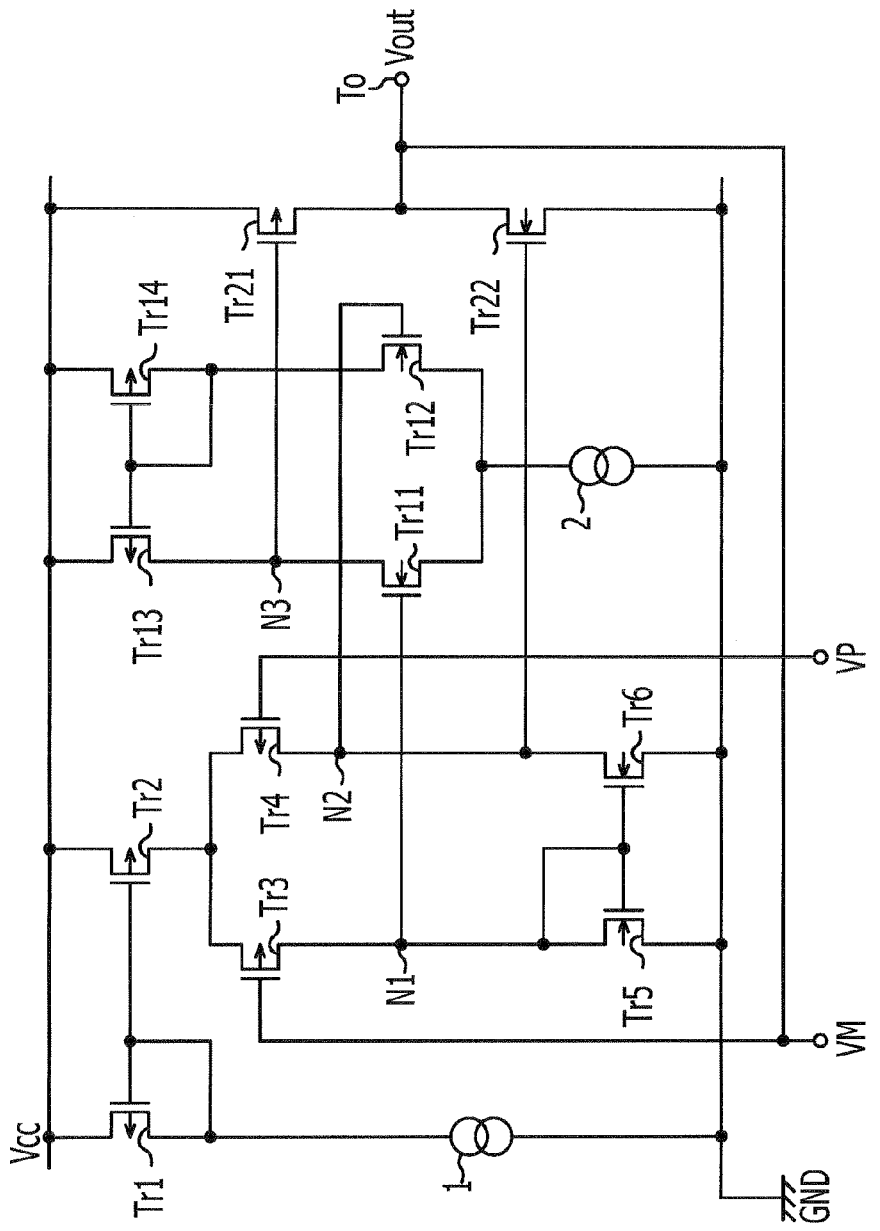
FIG. 4 is a circuit diagram illustrating an operational amplifier according to the related art.

As the value of the drain current I3 of the transistor Tr3 increases, the value of the drain current I5 of the transistor Tr15 increases, and the value of the drain current I6 of the transistor Tr16 increases. When the value of the drain current I6 increases, an operating current of the second differential amplifier circuit 20 (the differential pair 21) increases. As a result, the value of the current supplied from the transistor Tr21 to the transistor Tr22 may be higher compared with the operational amplifier in FIG. 4. Thus, the potentials of the nodes N1 and N2 may be caused to be substantially the same, and the output signal Vout may be caused to be at the voltage level of the input signal VP.

Described below is a case where the voltage level of the input signal VP falls after the output signal Vout is maintained at the voltage level of the input signal VP.

When the voltage level of the input signal VP falls, the value of the drain current I3 of the transistor Tr3 decreases, and the value of the drain current I4 of the transistor Tr4 increases. As a result, the voltage level of the node N2 rises and the transistor Tr22 is turned on.

When the potential of the node N2 becomes higher than the potential of the node N1, the potential of the node N3 in the second differential amplifier circuit 20 increases, and the output transistor Tr21 is turned off. Accordingly, the voltage level of the output signal Vout falls and the output signal Vout is maintained at the voltage value of the input signal VP. When the potential of the node N3 increases based on the difference between the nodes N1 and N2, the value of the current supplied from the transistor Tr21 to the transistor Tr22 decreases. When the value of the drain current of the transistor Tr22 decreases, the value of the gate-source voltage of the transistor Tr22 decreases. As a result, the potential of the node N2 decreases. Thus, the potentials of the nodes N1 and N2 become substantially the same.

As the value of the drain current I3 of the transistor Tr3 decreases, the value of the drain current I5 of the transistor Tr15 decreases, and the value of the drain current I6 of the transistor Tr16 decreases. When the value of the drain current I6 decreases, the operating current of the second differential amplifier circuit 20 (the differential pair 21) decreases. Accordingly, the value of the current supplied from the transistor Tr21 to the transistor Tr22 may be lower compared with the operational amplifier in FIG. 4. Thus, the potentials of the nodes N1 and N2 may be caused to be substantially the same, and the output signal Vout may be caused to be at the voltage level of the input signal VP.

The above embodiment may provide advantages described below.

(1) A common voltage (the voltage of the node N1) is supplied to the gate of the transistor Tr11 of the differential pair 21 and to the gate of the transistor Tr15 of the current source 22. Accordingly, the value of the gate voltage of the transistor Tr15 decreases depending on the gate voltage of the transistor Tr11 even when the drain voltage of the transistor Tr5 becomes lower than a set value due to the variation in the characteristics, which is caused by a manufacturing process for example, and the value of the gate voltage of the transistor Tr11 decreases. When the value of the gate voltage of the transistor Tr15 decreases, the value of the current I5 that flows through the transistor Tr15 decreases, and the value of the drain voltage of the transistor Tr15, that is, the source potential of the transistor Tr11 decreases. Thus, possible consequences due to the variation caused by the manufacturing process may be reduced more desirably, if not prevented, compared with the operational amplifier in FIG. 4, and the gate-source voltage that enables the transistor Tr15 to operate may be obtained as desired. As a result, occurrence of an undesired operation that may slow down the operating speed of the second differential amplifier circuit 20 may be reduced if not prevented.

The possible consequences due to the variation caused by the manufacturing process may be reduced, if not prevented, by supplying voltages (the voltages of the node N1 and N2) with substantially the same potentials to the gate of the transistor Tr12 of the differential pair 21 and to the gate of the transistor Tr16 of the current source 22.

Since the current of the current source 22 is controlled based on the voltage of the node N1 that varies depending on the difference between the potentials of the input signals VM and VP, the output signal Vout may be caused to be at the voltage level of the input signal VP due to the operation of the second differential amplifier circuit 20 activated with the current of the current source 22.

(2) The transistors Tr5 and Tr7 that determine the gate voltage of the transistor Tr11 of the differential pair 21 are coupled in series similar to the transistors Tr11 and Tr15. A common voltage (the voltage of the node N1) is supplied to the gates of the transistors Tr5, Tr7, Tr11, and Tr15. The transistors Tr5 and Tr11 have substantially the same electrical characteristics, and the transistors Tr7 and Tr15 have substantially the same electrical characteristics. Thus, the transistor Tr11 may operate with substantially the same electrical characteristics as the electrical characteristics of the transistor Tr5, and the transistor Tr15 may operate with substantially the same electrical characteristics as the electrical characteristics of the transistor Tr7. When variation in the characteristics of the transistors Tr5 and Tr7 is caused by a manufacturing process for example, the characteristics of the transistors Tr11 and Tr15 vary as well. Thus, the transistors Tr11 and Tr15 may operate with substantially the same electrical characteristics as the electrical characteristics of the transistors Tr5 and Tr7 regardless of the variation in the characteristics. Accordingly, regardless of the variation in the characteristics, the transistor Tr11 of the differential pair 21 may operate as desired as long as the transistor Tr5 may operate. Similarly, the transistor Tr12 of the differential pair 21 may operate as desired as long as the transistor Tr5 may operate. When the transistor Tr5 may operate, the drain voltage of the transistor Tr5 is within a range of values of an input voltage with which the second differential amplifier circuit 20 (the differential pair 21) may operate. Thus, the range of the values of the input voltage with which the second differential amplifier circuit 20 may operate may be secured as long as the first differential amplifier circuit 10 may operate.

(3) The gate voltage of the output transistor Tr22 is controlled using the first differential amplifier circuit 10. The drain current I8 (the idling current) of the output transistor Tr22 is determined using the transistors Tr1 to Tr8 that operate based on the constant current I1 of the current source 1. The gate voltage of the output transistor Tr21 is controlled using the second differential amplifier circuit 20. For example, the operating currents of the transistors Tr11 to Tr16 in the second differential amplifier circuit 20 are determined using the transistors Tr2 to Tr8 in the first differential amplifier circuit 10, which operate based on the constant current I1. The drain current I7 (the idling current) of the output transistor Tr21 is determined based on the operation of the second differential amplifier circuit 20. Since both of the idling currents of the output transistors Tr21 and Tr22 are determined based on the constant current I1 of the current source 1, the idling currents of the output transistors Tr21 and Tr22 may be controlled as desired. Besides, the occurrence of variation in the current of the current source for determining both of the idling currents may be reduced if not prevented. As a result, the occurrence of the undesired operation, such as generation of an offset voltage, resulting from the variation in the current may be reduced if not prevented.

The above embodiment may be changed as described below.

Figure 2:
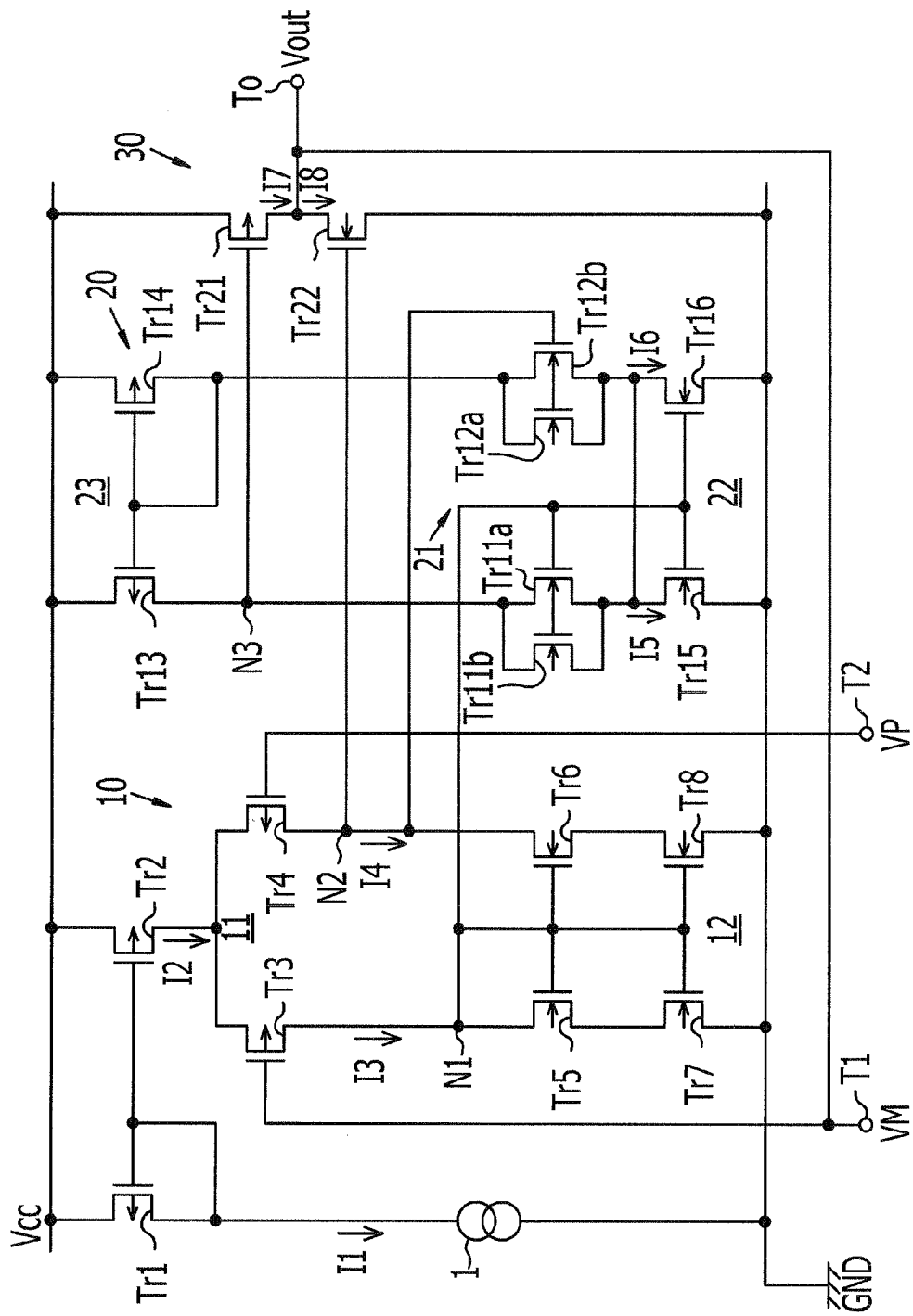
FIG. 2 is a circuit diagram illustrating another example of the operational amplifier according to the embodiment.

As illustrated in FIG. 2, the transistor Tr11 in FIG. 1 may be replaced with transistors Tr11a and Tr11b coupled in parallel, and the transistor Tr12 in FIG. 1 may be replaced with transistors Tr12a and Tr12b. The drains of the transistors Tr11a and Tr11b are coupled to the drain of the transistor Tr13. The sources of the transistors Tr11a and Tr11b are coupled to the drains of the transistors Tr15 and Tr16. The gates of the transistors Tr11a and Tr11b are coupled to the node N1. The drains of the transistors Tr12a and Tr12b are coupled to the drain of the transistor Tr14. The sources of the transistors Tr12a and Tr12b are coupled to the drains of the transistors Tr15 and Tr16. The gates of the transistors Tr12a and Tr12b are coupled to the node N2. The transistors Tr11a, Tr11b, Tr12a, and Tr12b may have substantially the same electrical characteristics as the electrical characteristics of the transistor Tr11 (Tr12).

According to the configuration described above, the gate-source voltages of the transistors Tr11a, Tr11b, Tr12a, and Tr12b may be caused to be lower compared with the configuration in FIG. 1. Accordingly, the values of the drain voltages of the transistors Tr15 and Tr16 that make up the current source 22 may be caused to increase, and the value of the current of the current source 22 may be caused to increase. Thus, the value of the operating current of the second differential amplifier circuit 20 may be caused to increase.

Figure 3:
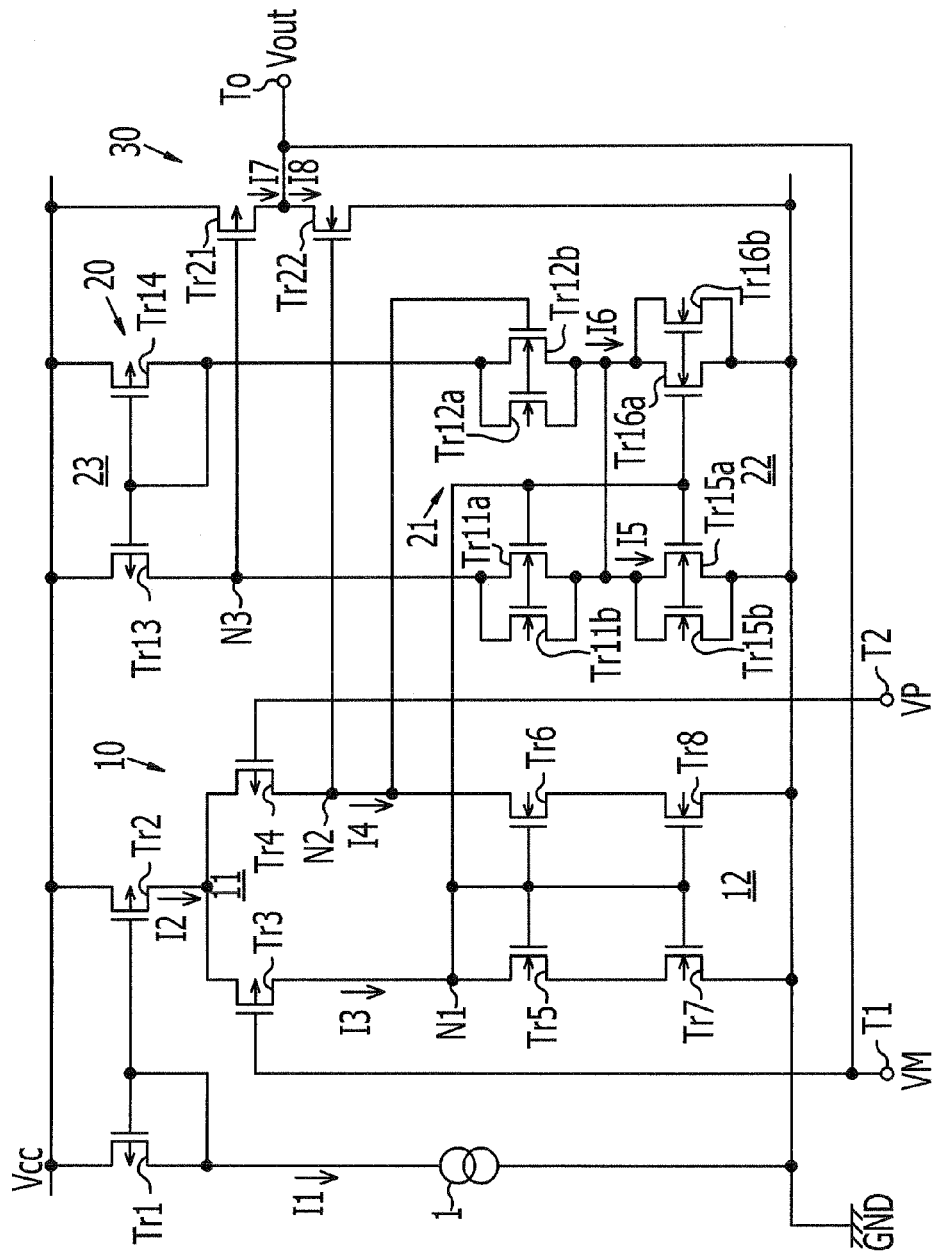
FIG. 3 is a circuit diagram illustrating another example of the operational amplifier according to the embodiment.

As illustrated in FIG. 3, the transistor Tr15 in FIG. 2 may be replaced with transistors Tr15a and Tr15b coupled in parallel. The transistor Tr16 in FIG. 2 may be replaced with transistors Tr16a and Tr16b coupled in parallel. The transistors Tr15a, Tr15b, Tr16a, and Tr16b may have substantially the same electrical characteristics as the electrical characteristics of the transistor Tr15 (Tr16).

The configuration illustrated in FIG. 3 may double the value of the current that flows through the current source 22 compared with the configuration of the operational amplifier in FIG. 1. Accordingly, the value of the operating current of the second differential amplifier circuit 20 may be doubled, and the operating speed of the second differential amplifier circuit 20 may be increased.

In the embodiment, the current mirror circuit 12 in the first differential amplifier circuit 10 is made up of the transistors Tr5 and Tr7 coupled in series, and the transistors Tr6 and Tr8 coupled in series. However, the transistors Tr7 and Tr8 may be omitted and the current mirror circuit 12 may be made up of the transistors Tr5 and Tr6. In this case, each of the channel lengths of the transistors Tr5 and Tr6 is preferably caused to be substantially the same as a length obtained by adding the channel length of the transistor Tr11 to the channel length of the transistor Tr15, and the transistors Tr5, Tr6, Tr11, and Tr15 are preferably caused to have substantially the same channel width.

The transistor Tr16 used in the embodiment may be omitted, and the current source 22 may be made up of the transistor Tr15.

In the embodiment, the PMOS transistors may be replaced with the NMOS transistors, and similarly, the NMOS transistors may be replaced with the PMOS transistors. In this case, the ground GND (the low potential power source) and the power source Vcc (the high potential power source) are desirably replaced with each other.

The operational amplifier according to the embodiment is configured as a voltage follower circuit. However, the configuration is not limited as long as an output from the output terminal To may be fed back to an input terminal. The drain voltages of the input transistors Tr3 and Tr4 may be caused to be substantially the same by controlling the drain current of the output transistor Tr22 and the gate-source voltage of the output transistor Tr21 with the second differential amplifier circuit 20.

The output transistors Tr21 and Tr22 according to the embodiment may be NMOS transistors. In this case, the drain voltages of the input transistors Tr3 and Tr4 may be caused to be substantially the same by controlling the drain current of one of the output transistors Tr21 and Tr22 using the second differential amplifier circuit 20 and controlling the gate-source voltage of the other one of the output transistors Tr21 and Tr22.

All examples and conditional language recited herein are intended for pedagogical purposes to aid the reader in understanding aspects of the invention and the concepts contributed by the inventor(s) to furthering the art, and are to be construed as being without limitation to such specifically recited examples and conditions, nor does the organization of such examples in the specification relate to a showing of the superiority and inferiority of the aspects of the invention. Although the embodiment in accordance with the aspects of the invention has been described in detail, it should be understood that various changes, substitutions, and alterations could be made hereto without departing from the spirit and scope of the invention.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

What is claimed is:

1. An operational amplifier, comprising:
   a first amplifier to which an input signal is applied; and
   a second amplifier to which an output of the first amplifier is applied, wherein the second amplifier includes:
      a first transistor including a first gate to which the output of the first amplifier is applied; and
      a second transistor including a second gate to which the output of the first amplifier is applied, and a drain coupled to a source of the first transistor, the second gate being connected to the first gate,
   wherein the first amplifier amplifies a potential difference between a potential of an input signal applied to a first input transistor and a potential of an input signal applied to a second input transistor, and outputs the amplified potential difference,
   a drain voltage of the first input transistor is supplied to the first gate of the first transistor and the second gate of the second transistor, and
   a drain voltage of the second input transistor is supplied to a gate of a third transistor of the second amplifier.

2. The operational amplifier according to claim 1, wherein the first transistor and the third transistor generate an output of the second amplifier based on a difference between the drain voltage of the first input transistor and the drain voltage of the second input transistor.

3. The operational amplifier according to claim 2, wherein the first amplifier includes:
   a fourth transistor including a drain and a gate that are coupled to a drain of the first input transistor; and
   a fifth transistor that includes a drain coupled to a source of the fourth transistor and includes a gate coupled to the drain of the fourth transistor.

4. The operational amplifier according to claim 3, wherein a ratio between a channel width of the first transistor and a channel length of the first transistor, and a ratio between a channel width of the fourth transistor and a channel length of the fourth transistor are substantially the same, and a ratio between a channel width of the second transistor and a channel length of the second transistor, and a ratio between a channel width of the fifth transistor and a channel length of the fifth transistor are substantially the same.

5. The operational amplifier according to claim 2, wherein the second amplifier further includes a sixth transistor including a drain coupled to the source of the first transistor, to a source of the third transistor, and to the drain of the second transistor, and
a gate of the sixth transistor is supplied with the drain voltage of the first input transistor.

6. The operational amplifier according to claim 3, wherein the first amplifier includes:
a seventh transistor that includes a drain coupled to a drain of the second input transistor and includes a gate coupled to the drain of the fourth transistor; and
an eighth transistor that includes a drain coupled to a source of the seventh transistor and includes a gate coupled to the drain of the fourth transistor.

7. The operational amplifier according to claim 2, wherein the first amplifier includes:
a plurality of ninth transistors coupled in series between a drain of the first input transistor and a power source; and
a plurality of tenth transistors coupled in series between a drain of the second input transistor and the power source, and the drain voltage of the first input transistor is supplied to a gate of each of the ninth transistors, and to a gate of each of the tenth transistors.

8. The operational amplifier according to claim 2, wherein the first amplifier includes:
an eleventh transistor coupled between a drain of the first input transistor and a power source; and
a twelfth transistor coupled between a drain of the second input transistor and the power source, and the drain voltage of the first input transistor is supplied to a gate of the eleventh transistor and a gate of the twelfth transistor.

9. The operational amplifier according to claim 2, wherein a thirteenth transistor having substantially the same size as the first transistor is coupled in parallel with the first transistor, and
a fourteenth transistor having substantially the same size as the third transistor is coupled in parallel with the third transistor.

10. The operational amplifier according to claim 9, wherein
a fifteenth transistor having substantially the same size as the second transistor is coupled in parallel with the second transistor.

11. The operational amplifier according to claim 1, wherein
the second amplifier has a polarity opposite to a polarity of the first amplifier.

12. The operational amplifier according to claim 2, further comprising:
a first output transistor coupled to an output terminal; and
a second output transistor coupled to the output terminal, wherein
the first amplifier causes the drain voltage of the second input transistor to be supplied to a gate of the second output transistor, and
the second amplifier operates based on a current supplied from the second transistor that operates as a current source, and controls a drain current of the first output transistor based on a difference between the drain voltage of the first input transistor and the drain voltage of the second input transistor so that the drain voltage of the first input transistor and the drain voltage of the second input transistor become substantially the same.

13. An operational amplifier comprising:
a first amplifier including:
a first differential pair;
a first current mirror circuit; and
a first current source; and
a second amplifier including:
a second differential pair; and
a second current source,
wherein the first differential pair includes:
a first transistor including a gate to which a first input signal is supplied, the first transistor having a first polarity; and
a second transistor including a gate to which a second input signal is supplied, the second transistor having the first polarity,
wherein the first current mirror circuit includes:
a third transistor including a drain and a gate that are coupled to a drain of the first transistor, the third transistor having a second polarity opposite to the first polarity; and
a fourth transistor that includes a drain coupled to a drain of the second transistor and includes a gate coupled to a drain of the third transistor, the fourth transistor having the second polarity,
wherein the first current source supplies a first current to the first differential pair,
wherein the second differential pair includes:
a fifth transistor including a gate to which a drain voltage of the first transistor is supplied, the fifth transistor having the second polarity; and
a sixth transistor including a gate to which a drain voltage of the second transistor is supplied, the sixth transistor having the second polarity, and
wherein the second current source supplies a second current to the second differential pair and includes:
a seventh transistor that includes a drain coupled to a source of the fifth transistor and to a source of the sixth transistor and includes a gate to which the drain voltage of the first transistor is supplied, the seventh transistor having the second polarity.

14. The operational amplifier according to claim 13, wherein
the first current mirror circuit includes:
an eighth transistor that includes a drain coupled to a source of the third transistor and includes a gate to which a drain voltage of the third transistor is supplied, the eighth transistor having the second polarity; and
a ninth transistor that includes a drain coupled to a source of the fourth transistor and includes a gate to which the drain voltage of the third transistor is supplied, the ninth transistor having the second polarity.

15. The operational amplifier according to claim 14, wherein
the third transistor, the fourth transistor, the fifth transistor, and the sixth transistor have substantially the same electrical characteristics, and
the seventh transistor, the eighth transistor, and the ninth transistor have substantially the same electrical characteristics.

16. The operational amplifier according to claim 13, wherein the second amplifier further includes a second current mirror circuit including:
  a tenth transistor including a drain and a gate that are coupled to a drain of the sixth transistor, the tenth transistor having the first polarity; and
  an eleventh transistor that includes a drain coupled to a drain of the fifth transistor and includes a gate coupled to a drain of the tenth transistor, the eleventh transistor having the first polarity.

17. The operational amplifier according to claim 13, further comprising:
  an output stage circuit including:
    a first output transistor including a gate to which a drain voltage of the eleventh transistor is supplied; and
    a second output transistor including a gate to which the drain voltage of the second transistor is supplied.

* * * * *